(12) United States Patent
Chen

(10) Patent No.: US 7,821,281 B2
(45) Date of Patent: Oct. 26, 2010

(54) METHOD AND APPARATUS OF TESTING DIE TO DIE INTERCONNECTION FOR SYSTEM IN PACKAGE

(75) Inventor: Wang Chin Chen, Kaohsiung (TW)

(73) Assignee: Faraday Technology Corp., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 12/390,899

(22) Filed: Feb. 23, 2009

(65) Prior Publication Data
US 2010/0213965 A1    Aug. 26, 2010

(51) Int. Cl.
*G01R 31/02* (2006.01)
(52) U.S. Cl. ........................ 324/763; 324/765
(58) Field of Classification Search ......... 324/537–765; 714/17–21
See application file for complete search history.

(56) References Cited

U.S. PATENT DOCUMENTS

| | | | | |
|---|---|---|---|---|
| 4,186,338 | A | * | 1/1980 | Fichtenbaum ............... 324/521 |
| 5,006,808 | A | * | 4/1991 | Watts .......................... 324/537 |
| 5,513,188 | A | | 4/1996 | Parker et al. |
| 5,557,209 | A | * | 9/1996 | Crook et al. ................. 324/537 |
| 5,801,536 | A | * | 9/1998 | Brambilla et al. ............ 324/522 |
| 6,104,198 | A | * | 8/2000 | Brooks ........................ 324/538 |
| 6,297,643 | B2 | * | 10/2001 | De Jong et al. .............. 324/537 |
| 6,472,747 | B2 | * | 10/2002 | Bazarjani et al. ............ 257/724 |
| 6,717,415 | B2 | * | 4/2004 | Sunter ......................... 324/519 |
| 6,835,579 | B2 | * | 12/2004 | Elward ........................ 438/15 |
| 7,425,836 | B2 | * | 9/2008 | Chow et al. .................. 324/681 |
| 7,612,568 | B2 | * | 11/2009 | Chen et al. ................... 324/538 |
| 7,698,610 | B2 | * | 4/2010 | Gomez Arguello .......... 714/724 |
| 2002/0121679 | A1 | * | 9/2002 | Bazarjani et al. ............ 257/666 |
| 2009/0079440 | A1 | * | 3/2009 | Williamson et al. ......... 324/612 |
| 2009/0224794 | A1 | * | 9/2009 | Hyobu ......................... 324/765 |

FOREIGN PATENT DOCUMENTS

| | | |
|---|---|---|
| JP | 10185995 | 7/1998 |
| JP | 10197891 | 7/1998 |
| JP | 2003-243799 A | 8/2003 |
| WO | 2005/089032 | 9/2005 |

* cited by examiner

*Primary Examiner*—Ha Tran T Nguyen
*Assistant Examiner*—Richard Isla Rodas
(74) *Attorney, Agent, or Firm*—Winston Hsu; Scott Margo; Min-Lee Teng

(57) ABSTRACT

Method and apparatus of testing die to die interconnection for system in package (SiP). For testing a die to die interconnection connected between two pads of two dice, an IO buffer, e.g., a bi-directional IO buffer, in one of the two dice coupled to one of the two pads is arranged. An oscillating feedback is formed between an output port and an input port of the IO buffer, such that a state, e.g., an open state, a short state or a normal state of the die to die interconnection is tested according to a timing characteristic, e.g., a frequency, of a signal of the IO buffer.

15 Claims, 10 Drawing Sheets

METHOD AND APPARATUS OF TESTING DIE TO DIE INTERCONNECTION FOR SYSTEM IN PACKAGE

FIELD OF THE INVENTION

The present invention relates to method and apparatus of testing die to die interconnection for system in package (SiP) or 3D IC, and more particularly, to method and apparatus of testing die to die interconnection by observing a frequency of an oscillating circuit composed of an IO buffer and auxiliary circuit. The frequency depends on the capacitance value appears on a die to die interconnection.

BACKGROUND OF THE INVENTION

As functionality requirements for integrated circuits (ICs) grow, more and more functional blocks are desired to be integrated into a single IC. System in package (SiP) provides a solution for this demand. In an IC formed with SiP technology, dice of various functions are encapsulated in a single package; these dice are connected with die to die interconnections inside the package for signal interchange, so their functions can be integrated to act like a single chip IC.

Since the die to die interconnections are encapsulated in package with no direct path for ATE (automatic test equipment) probing, it is difficult to test state of each die to die interconnection, e.g., whether the interconnection is well connected. A prior art of testing interconnection involves boundary scan methodology. Boundary scan are designed to test by logic functionality, i.e., test patterns are fed into circuits and resultant logic outputs are scanned out to decide whether the circuits operate normally. However, boundary scan does not apply to SiP very well, because it requires that all dice in SiP must be equipped with circuits that support boundary scan. Also it requires proper test patterns, which are usually difficult and costly to be generated or obtained.

SUMMARY OF THE INVENTION

Therefore, an object of the present invention is to provide method and apparatus capable of testing die to die interconnection for SiP. An IO buffer having an input port and an output port is arranged for testing an die to die interconnection connected to a pad which couples to the IO buffer. While testing the die to die interconnection, a feedback between the output port, the input port and an inverter (i.e., a feedback circuit) forms a ring oscillator, such that an oscillating frequency of the ring oscillator reflects an equivalent capacitance appeared on the pad of IO buffer. The equivalent capacitance is composed of the capacitances of IO buffer, interconnection and pad of another die. The capacitance relates to the state (e.g., an open state, a short state or a normal state) of the interconnection, so the state of the interconnection can be tested by observing the oscillating frequency of the ring oscillator. While die to die interconnection testing is no longer required, the oscillating feedback is disconnected (e.g., decoupled with the input port), so the IO buffer can function like an ordinary IO buffer, i.e., the IO buffer either receives a signal from the pad and outputs corresponding received signal to the output port, or drives an output signal on the pad according to a signal received from the input port. An optional auxiliary circuit is used for reflecting states of the die to die interconnection according to the oscillating frequency.

Accordingly, the present invention tests connection state of die to die interconnection that can not be directly probed by ATE. Also, circuitry relating to testing is implemented in a given die among at least two dice integrated in a SiP package and measures die to die interconnection state from this given die.

According to an aspect of the present invention, an IO circuit capable of testing die to die interconnection includes: an output buffer coupled to a pad connected to an under test interconnection, the output buffer driving an output signal on the pad according to a signal received from an input port; an input buffer coupled to the pad, the input buffer providing a received signal to an output port according to a signal received from the pad; an inverter (as a feedback circuit) coupled between the input port and the output port, wherein while testing the die to die interconnection, the inverter inverts signal of output port and feeds to the input port while testing the die to die interconnection. Such circuits form a ring oscillator and its oscillating frequency depends on the capacitance value appeared on the IO pad. The output buffer driving strength and pad equivalent capacitance determine the oscillating frequency because higher driving capability can charge/discharge equivalent capacitance quicker.

In an embodiment according to the aforementioned IO circuit, an auxiliary circuit is included for reflecting state of the die to die interconnection. The auxiliary circuit is a frequency divider that divides high frequency to low for low speed frequency measurement equipment.

In an embodiment according to the aforementioned IO circuit, the auxiliary circuit decides whether a frequency of ring oscillator is in a predetermined range for reflecting the state of the die to die interconnection.

In an embodiment according to the aforementioned IO circuit, the auxiliary circuit reflects an open state, a short state or a normal state of die to die interconnection according to the oscillating frequency of ring oscillator.

In an embodiment according to the aforementioned IO circuit, which further includes a test controller controlling whether the IO circuit works as an ordinary mode or die to die interconnection test mode.

In an embodiment according to the aforementioned IO circuit, the inverter circuit provides inverted signal to cause an oscillating feedback path while testing die to die interconnection.

According to another aspect of the present invention, an IO circuit capable of testing die to die interconnection includes a plurality of IO cells and an auxiliary circuit. Each IO cell corresponds to a pad connected to a respective die to die interconnection, and each IO cell includes: an output buffer coupled to the corresponding pad, the output buffer driving an output signal on the corresponding pad according to a signal received from an input port; an input buffer coupled to the corresponding pad, the input buffer providing a received signal to an output port according to a signal received from the corresponding pad; and an inverter (as an embodiment of a feed circuit) coupled between the input port and the output port, wherein while testing the corresponding die to die interconnection, the feedback circuit provides an inverted signal of the received signal such that the feedback signal is transmitted to the input port while testing the corresponding die to die interconnection.

In an embodiment according to the aforementioned IO circuit, it further includes a test controller controlling testing of die to die interconnection such that each IO cell tests the corresponding die to die interconnection in different time.

In an embodiment according to the aforementioned IO circuit, the oscillating frequency of oscillator depends on the time of charging and discharging equivalent capacitance appeared on pad of IO circuit.

In an embodiment according to the aforementioned IO circuit, the auxiliary circuit is a frequency divider for dividing the frequency when testing die to die interconnection pad to lower frequency for some low cost ATE.

In an embodiment according to the aforementioned IO circuit, the auxiliary circuit decides whether a frequency of a signal of each IO cell is in a predetermined range for reflecting the state of the corresponding die to die interconnection.

In an embodiment according to the aforementioned IO circuit, the state of the die to die interconnection refers to an open state, a normal state or a short state.

According to another aspect of the present invention, an input buffer with controllable pull up element (Ru) and pull down element (Rd) resistance is used to test die to die interconnection. The circuitry includes: an input buffer coupled to a pad connected to an under test interconnection, the elements Rd and Ru connected to power and ground voltages, respectively. The Ru and capacitance of pad form a charge path, and Rd and capacitance of pad forms a discharge path. An inverter (a feedback circuit) controls the elements Ru and Rd to charge and discharge capacitance of pad. The element Ru is charging the capacitance of pad when voltage on pad is logic "0". When voltage on pad reaches VIH (voltage input high) the input buffer and inverter turn off the element Ru to disconnect charge path and turn on the element Rd to connect the discharge path. While the voltage on pad is less than VIL (voltage input low), the input buffer and inverter turn off the Rd to disconnect discharge path and turn on the element Ru to connect the charge path. The charge and discharge occurs periodically and the charge and discharge time depend on the values of elements Ru and Rd and capacitance of pad.

According to a further aspect of the present invention, a method for testing die to die interconnection connected to a pad of an IO buffer including: forming an oscillator as an oscillating feedback between an output port and an input port of the IO buffer, and deciding a state of the die to die interconnection according to oscillating frequency.

In an embodiment according to the aforementioned method, wherein deciding the state of the die to die interconnection according to the oscillating frequency of the invention circuit includes: deciding whether the state of die to die interconnection is an open state, a short state or a normal state according to whether a frequency of formed oscillator is in a predetermined range.

BRIEF DESCRIPTION OF THE DRAWINGS

The above contents of the present invention will become more readily apparent to those ordinarily skilled in the art after reviewing the following detailed description and accompanying drawings, in which.

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only; it is not intended to be exhaustive or to be limited to the precise form disclosed.

Figure 1:
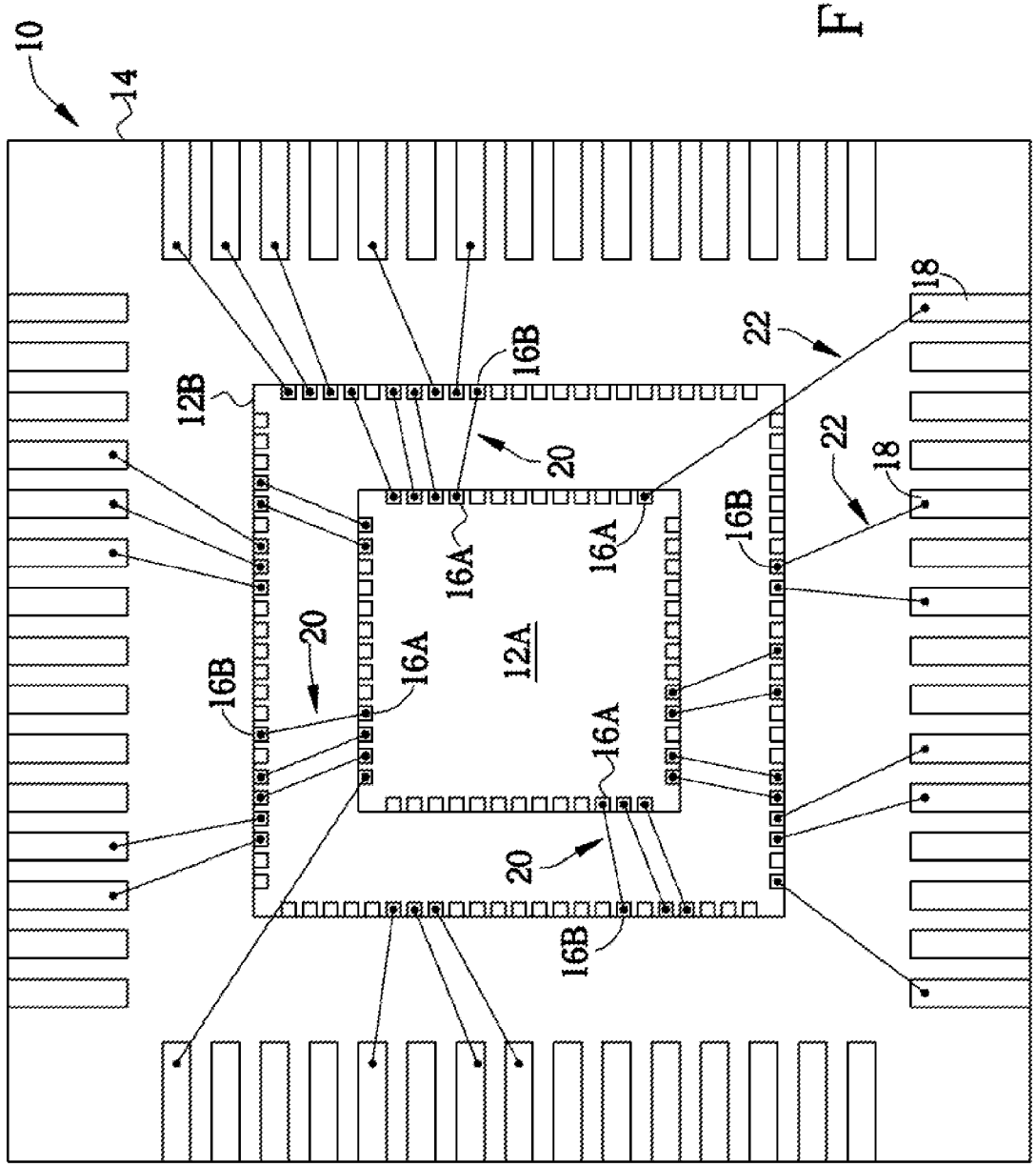
FIG. 1 illustrates die to die interconnection in SiP.

Please refer to FIG. 1, which illustrates die to die interconnections in a SiP 10. The SiP 10 includes (at least) two dice 12A and 12B encapsulated in a package 14 with conductive package leads 18. The die 12A (arranged on top of the die 12B in this example) has a plurality of pads (e.g., IO pads) 16A, the die 12B also has its own pads (e.g., IO pads) 16B. To integrate functions of dice 12A and 12B, die to die interconnection 20 are formed between some of the pads 16A and 16B, with each die to die interconnection 20 connected between a corresponding pad 16A of the die 12A and a corresponding pad 16B of the die 12B. With these die to die interconnections 20, dice 12A and 12B can interchange signal (e.g., data and/or analog signal). Also, some other pads 16A and 16B are connected to package leads 18 with bonding wires 22 so the dice 12A and 12B can interchange signal or obtain power through package leads 18. Usually the dice 12A and 12B have been tested before they are encapsulated, so they are sometimes refer to as known-good dice (KGD).

Figure 2:
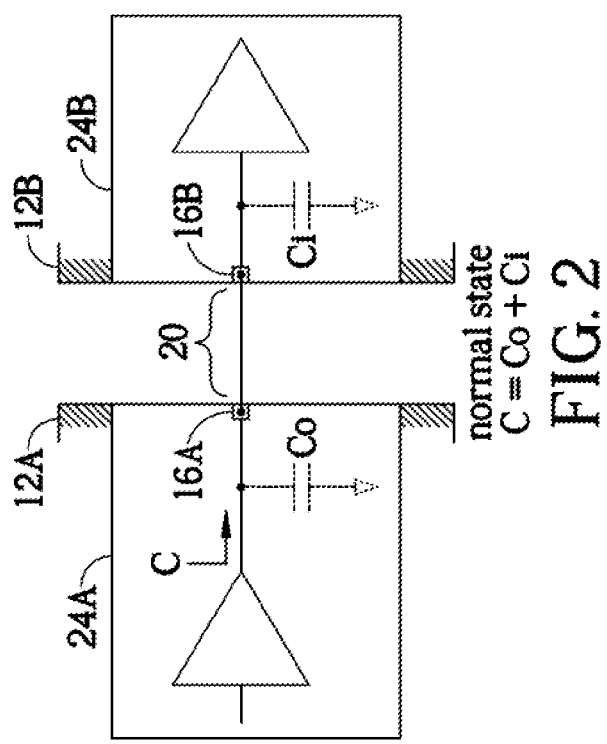

Die to die interconnections 20 are very important to keep SiP 10 working normally. However, states of the die to die interconnections are difficult to test, since each die to die interconnection 20 and both of its terminals (i.e., pads 16A and 16B) is encapsulated in the package 14. Please refer to FIGS. 2-4 which conceptually illustrate possible states of a die to die interconnection. Generally speaking, a pad of a die has a corresponding IO cell for handling signal input/output on that pad, so each IO cell includes either an input buffer, an output buffer or an IO buffer (e.g., a bi-directional IO buffer), also an ESD (electric-static discharge) related circuit may be included. As depicted in FIG. 2, a pad 16A of the die 12A couples to a corresponding IO cell 24A, a pad 16B of the other die 12B couples to its corresponding IO cell 24B, and a die to die interconnection 20 is connected between the pads 16A and 16B.

Electrically, each of pads 16A and 16B has a corresponding equivalent capacitor with capacitance caused by circuits of corresponding IO cells. Like the illustration in FIG. 2, an equivalent capacitor Co appears on the pad 16A, and an equivalent capacitor Ci appears the pad 16B. As shown in FIG. 2, if the die to die interconnection 20 is in a normal state, i.e., it is well connected, a total capacitor C appeared on the pad 16A should substantially approximate a sum of the equivalent capacitors Co and Ci. That is, C=Ci+Co.

Figure 3:
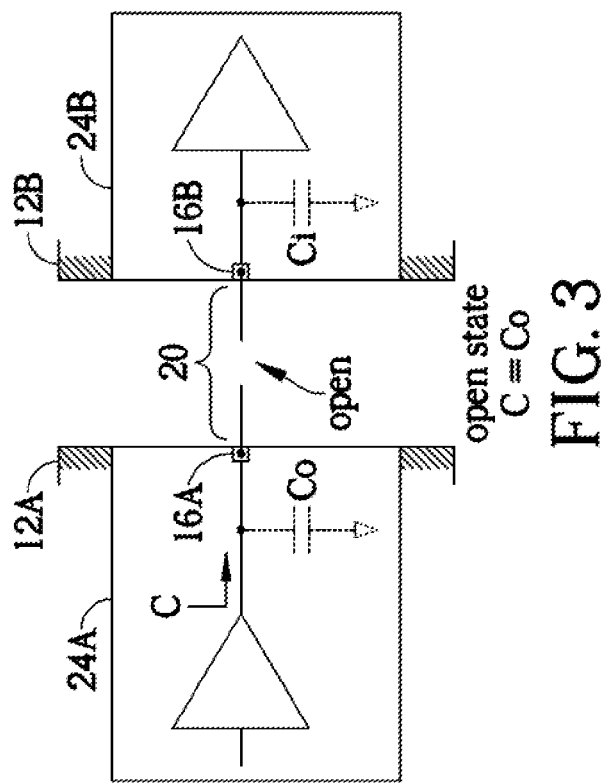
FIGS. 2-4 illustrate possible states of an die to die interconnection shown in FIG. 1.

On the contrary, if the die to die interconnection is not well connected, the total capacitor C will be different from (Ci+Co). As shown in FIG. 3, when the die to die interconnection is in an open state, i.e., the die to die interconnection is faultily open failing to connect pads 16A and 16B, the total capacitor appeared on the pad 16A will approximate Co instead of (Co+Ci) in normal state.

Figure 4:
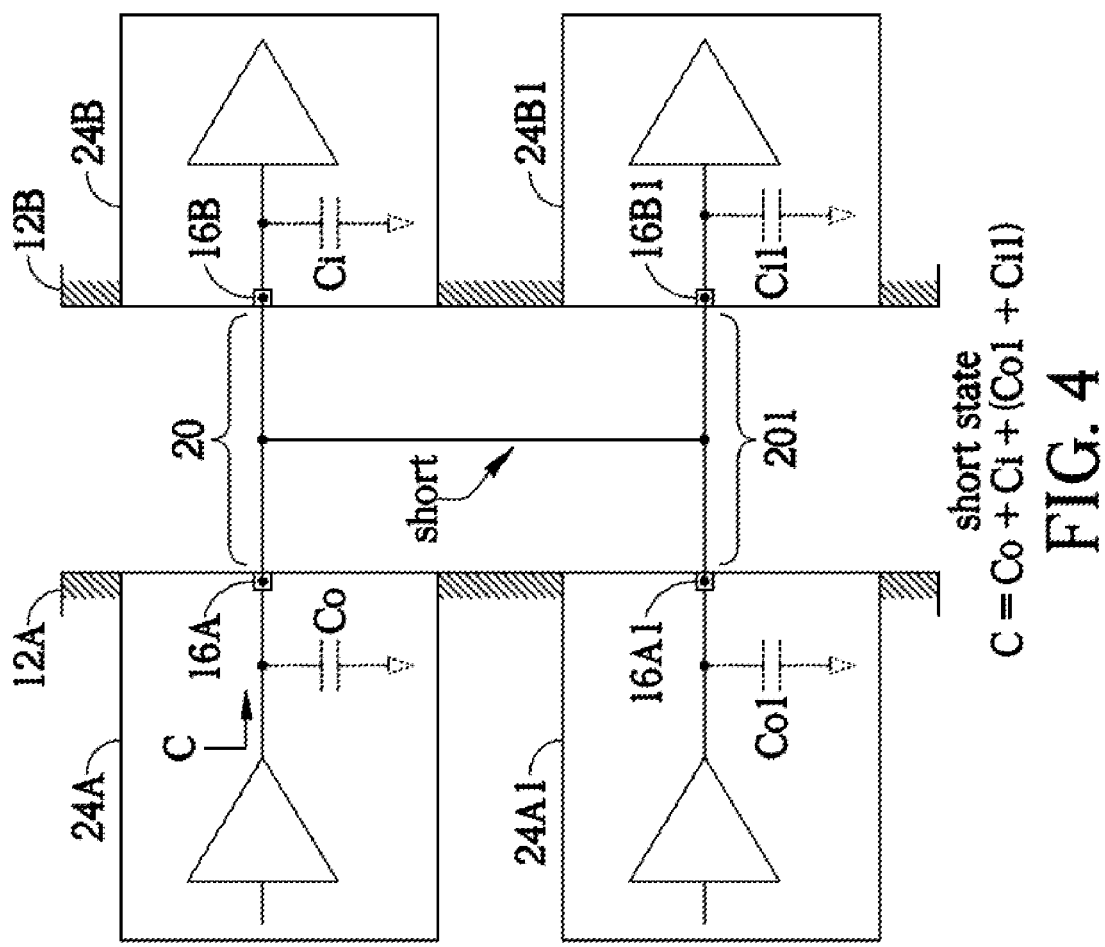

Another possible defect of die to die interconnection is shown in FIG. 4 when two die to die interconnections are faultily short together. Besides the IO cells 24A and 24B, pads 16A and 16B, equivalent capacitors Co and Ci as well as the die to die interconnection 20, another pair of IO cells 24A1, 24B1, corresponding pads 16A1, 16B1 with respective equivalent capacitors Co1 and Ci1 as well as a die to die interconnection 201 between pads 16A1 and 16A2 are also shown in FIG. 4. Normally the die to die interconnections 20 and 201 should be isolated to each other. However, in a short state wherein the die to die interconnections 20 and 201 are faultily short together, the total capacitor appeared on the pad 16A will approximate (Ci+Co+Ci1+Co1) instead of (Co+Ci) in normal state or Co in open state.

From FIGS. 2 to 4, it is observed that a total capacitor C appeared on a pad (e.g., pad 16A) will be affected by connection state (e.g., normal, open or short state) of corresponding die to die interconnection. Therefore, the present invention can test state of a die to die interconnection according to a total capacitor appeared on a pad connected to the die to die interconnection. Please refer to FIG. 5, which shows a conceptual circuit diagram for testing die to die interconnection according to the present invention. An IO buffer 28 coupled to a pad 16 is arranged for testing a die to die interconnection 20 connected to the pad 16.

The IO buffer 28 has an input port Ip and an output port Op so the IO buffer 28 can function like an ordinary IO buffer. That is, the IO buffer 28 can either receives signal from the pad 16 and outputs a corresponding received signal Sr to the output port Op, or drives an output signal Sd on the pad 16 according to a signal Si received from the input port Ip.

Figure 5:
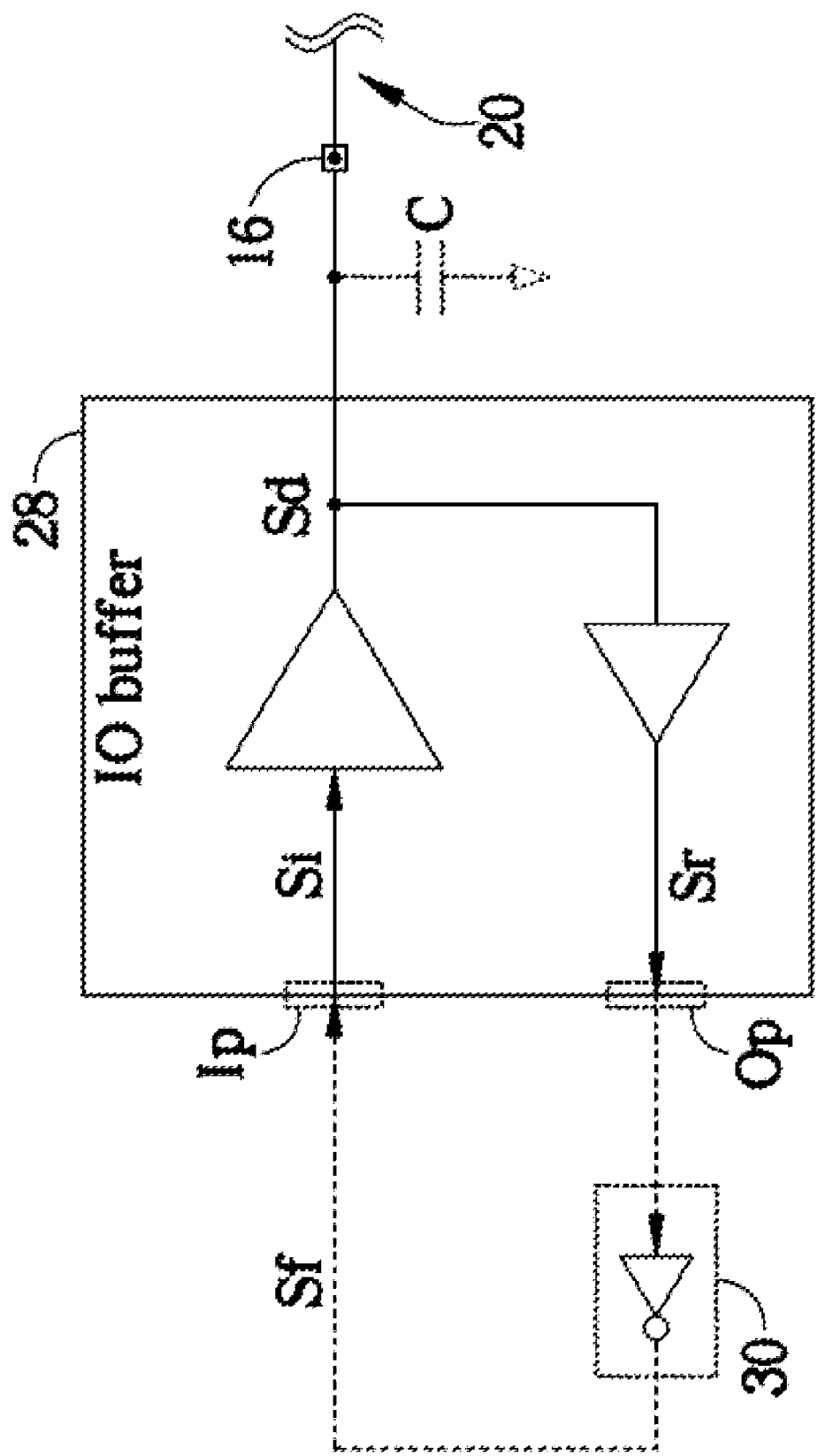
FIG. 5 is a conceptual circuit diagram for testing die to die interconnection according to the present invention.

While testing the die to die interconnection, an oscillating feedback between the output port Op and the input port Ip is formed by coupling a feedback circuit 30 between the output port Op and the input port Ip. That is, the feedback circuit 30 can provide a feedback signal Sf according to the received signal Sr while testing the die to die interconnection 20, such that the feedback signal Sf can be transmitted to the input port Ip to become an input signal Si at the port Ip, and thus the IO buffer 28 and the feedback circuit 30 are connected as a feedback loop. As shown in FIG. 5, an embodiment of the feedback circuit 30 includes an inverter, which introduces a 180 degree phase shift between signals Sr and Sf to make an oscillating feedback loop. Since the total capacitor C appeared on the pad 16 is a load of the feedback loop, a frequency (an oscillating frequency) of a signal of the IO buffer 28 (e.g., signal Sf or Si at the input port Ip of the IO buffer 28) reflects the total capacitor C, and the state of the die to die interconnection 20 can be tested according to the frequency. Typically, as the total capacitor C is larger, the frequency becomes lower (slower). While die to die interconnection testing is no longer needed, the oscillating feedback is disconnected (e.g., decoupled with the input port Ip), so the IO buffer 28 can function like an ordinary IO buffer again.

Figure 6:
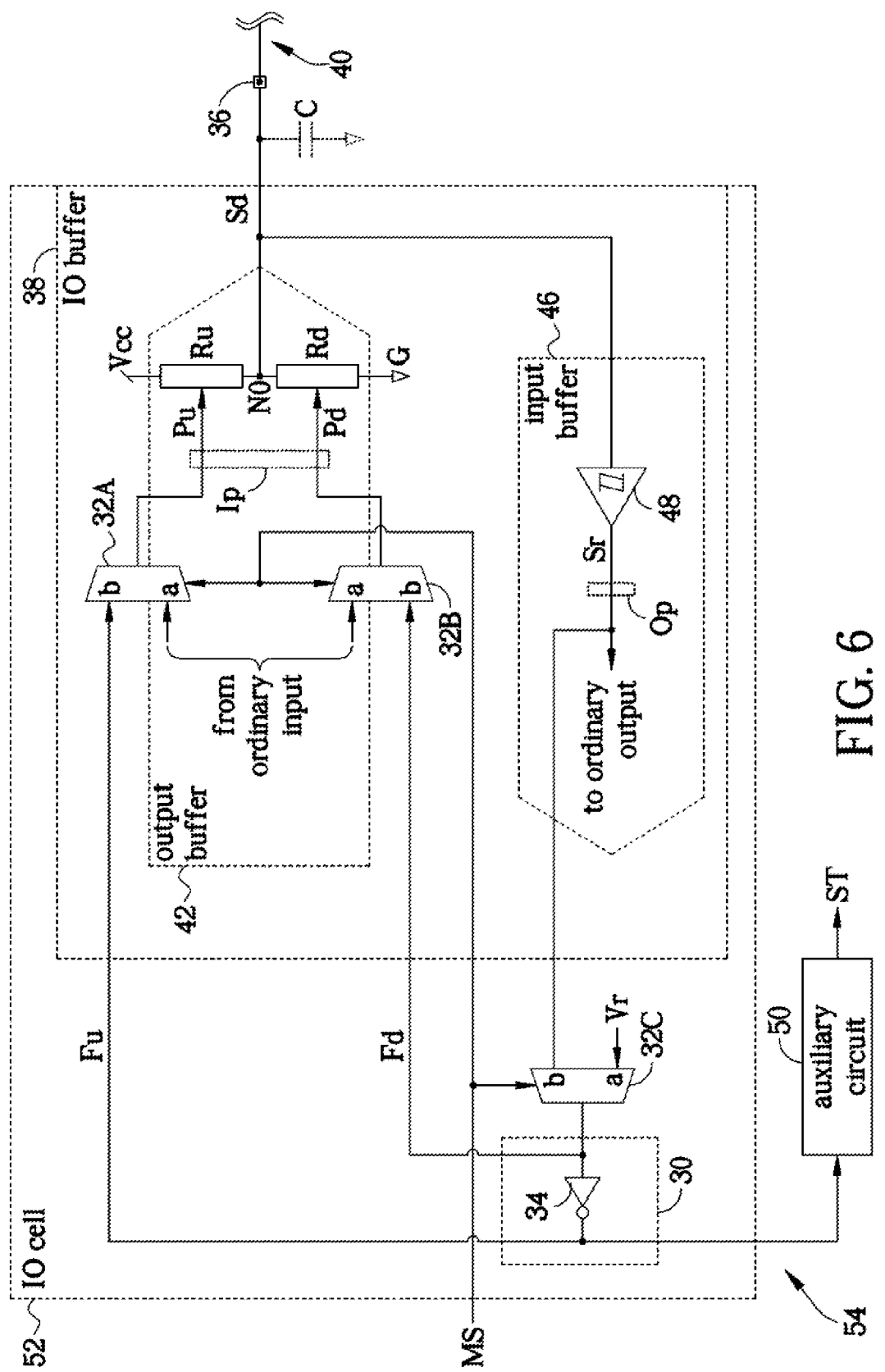
FIG. 6 shows an embodiment to implement the concept disclosed in FIG. 5.

To implement the concept shown in FIG. 5, please refer to FIG. 6 which depicts an embodiment according to the present invention. An IO circuit 54 capable of testing die to die interconnection includes an IO cell 52 and an auxiliary circuit 50. The IO cell 52, which includes an IO buffer 38 coupled to a pad 36 connected to a die to die interconnection 40, supports the proposed die to die interconnection test with a feedback circuit 30 and multiplexers 32A, 32B and 32C. In this embodiment, the IO buffer 38 includes an input buffer 46 and an output buffer 42 to support functionality of a bi-directional IO buffer. The output buffer 42, coupled to the pad 36, can drive an output signal Sd on the pad 36 according to a signal received from an input port Ip. The input buffer 46, also coupled to the pad 36, can provide a received signal Sr to an output port Op according to a signal received from the pad 36. Note that the input port Ip of the output buffer 42 can be a port for receiving ordinary input signal (when the output buffer 42 works like an ordinary output buffer), or the input port Ip can generally refer to any port or pin(s) where a signal can be inputted into a portion (e.g., a stage or a sub-block) of the output buffer 42. For example, the input port Ip shown in FIG. 6 refers to an input to a driving stage of the output buffer 42, wherein the driving stage has two elements Ru and Rd respectively controlled by signals Pu and Pd inputted from the input port Ip. Although not shown in FIG. 6, the output buffer 42 may also has other stage(s) or sub-block(s), like an input stage for receiving ordinary input and/or a level shifter for interfacing signals of different power voltages. Similarly, the output port Op of the input buffer 46 can be a port for outputting ordinary received signal (when the input buffer 46 works like an ordinary input buffer), or the output port can generally refer to any port or pin(s) where a signal can be outputted from a portion (e.g., a stage or a sub-block) of the input buffer 46. In FIG. 6, the input buffer 46 includes a Schimtt trigger (or an amplifier with hysteresis) 48 which outputs the signal Sr through the output port Op.

In an embodiment of the invention, the two elements Ru and Rd are biased between power voltage Vcc and ground voltage G. The element Ru is a resistance that can be formed by p-MOS device or any material during fabricating. It has a control pin that receives signal Pu to control whether the element Ru conducts to the power voltage Vcc. The element Rd is a resistance that can be formed by p-MOS device or any material during fabricating. It has a control pin that receives signal Pd to control whether the element Rd conducts to the ground voltage G. When the element Ru conducts to the power voltage Vcc, it provides a resistor path to pass through a current from the power voltage Vcc so that the total capacitor C appeared on the pad 36 is charged. Similarly, when the element Rd conducts, it also provides a resistor path to the ground voltage G to discharge the total capacitor C.

In the embodiment shown in FIG. 6, the feedback circuit 30, coupled between the input port Ip and the output port Op, includes an inverter 34 to provide a pair of complementary feedback signals Fu and Fd. More specifically, the feedback circuit 30 is coupled to the output port Op through the multiplexer 32C, and is coupled to the input port Ip through the multiplexers 32A and 32B respectively corresponding to the two feedback signal Fu and Fd of the feedback circuit 30. The multiplexers 32A, 32B and 32C are controlled by a signal MS for mode selection. Other circuits, like a buffer between the multiplexer 32C and the inverter 34 (not shown) can also be included in the feedback circuit 30.

The IO cell 52 and the IO circuit 54 can operate in a standard mode and a test mode, and the signal MS reflects the mode in which the IO cell 52 operates. When the IO circuit 54 and the IO cell 52 work in the test mode, i.e., while testing the die to die interconnection 40, the input buffer 46 operates to provide the received signal Sr according to the signal Sd driven by the output buffer 42. The multiplexer 32C, controlled by the signal MS, switches to transmit the signal Sr from the output port Op to the feedback circuit 30. The inverter 34 inside the feedback circuit 30 generates the corresponding feedback signals Fu and Fd. The multiplexers 32A and 32B, also controlled by the signal MS, switch to transmit the signals Fu and Fd to the input port Ip to respectively become the signals Pu and Pd, so that the elements Ru and Rd can drive the signal Sd at the node N0 accordingly. Thus, an oscillating feedback is formed to complete a feedback loop, and an oscillating frequency of the feedback loop will reflect the equivalent total capacitor C appeared on the pad 36, as discussed in FIGS. 2-5.

More specifically, in the embodiment shown in FIG. 6, the auxiliary circuit 50 will reflect the state of the die to die interconnection 40 according to a frequency of the feedback signal Fu (though other signals involved in the feedback loop can also be used, such as signal Fd). In one embodiment, the auxiliary circuit 50 is a frequency divider which performs frequency dividing on the feedback signal Fu to generate a corresponding signal ST with lower frequency. This signal ST, with a lower frequency being a quotient of frequency dividing, is suitable to be outputted to an external measuring equipment (an ATE) through a pad connecting to a package lead, as explained in FIG. 1, so that its frequency can be measured to determine the state of die to die interconnection 40. The input source of frequency divider can be either signal Fu or Fd because the frequencies of these two signals are the same. In addition, the signal Fd or Fu can be directly outputted to an output pad that ATE can probe without the auxiliary circuit 50.

Alternatively, the auxiliary circuit 50 can be a frequency comparator, which decides whether the frequency of the feedback signal Fu is in a predetermined range for reflecting the state of the die to die interconnection 40. As discussed in FIGS. 2-5, the total capacitor C corresponding to an open state die to die interconnection is of less capacitance, so the corresponding oscillating frequency is higher. On the other extreme, the total capacitor C corresponding to a short state is of larger capacitance to make the frequency lower. Between these two extreme states, the capacitance of the capacitor C corresponding to a normal state die to die interconnection leads to an oscillation frequency between the oscillation frequencies respectively corresponding to open and short states. Therefore, a predetermined range with two frequency thresholds can be expected, wherein if the oscillating frequency measured by the auxiliary circuit 50 is higher than a high frequency threshold of the predetermined range, the auxiliary circuit 50 reflects a fail connection state in the signal ST. Otherwise, if the frequency measured is lower than a low frequency threshold of the predetermined range, a fail connection is reflected in the signal ST; and if the frequency measured is between the high and low frequency thresholds, a normal state is reflected. The resultant signal ST can be outputted with another pad connected to a package lead. In such embodiment, the signal ST can be a logic signal carrying information representing state of die to die interconnection with logic data bit(s). In still another embodiment, the auxiliary circuit 50 can combine a frequency divider and a frequency comparator which decide state of die to die interconnection according to a frequency derived from frequency dividing. The signal ST can be a one-bit digital signal reflecting normal or fail connection (including open and short) states of the die to die interconnection under test. Alternately, the signal ST can extend to two bits that it can indicate open, short and normal states of the die to die interconnection under test.

When the IO circuit 54 and the IO cell 52 operate in a standard mode (i.e., while die to die interconnection test has been finished or no longer required), the multiplexer 32C, controlled by the signal MS, switches to tie a reference voltage Vr to the feedback circuit 30 instead of keeping on transmitting the signal Sr to the feedback circuit 30. The reference voltage Vr can be the power voltage Vcc or the ground voltage G such that the feedback circuit 30 is kept static. Also, the multiplexers 32A and 32B switch to transmit ordinary input signals to the input port Ip, instead of the feedback signals Fu and Fd. With switching operation of the multiplexers 32A and 32B, the feedback circuit 30 is decoupled from the input port Ip, and the oscillating feedback is thus disconnected to break the feedback loop of test mode. Then the IO buffer 38 can work like an ordinary bi-direction IO buffer to handle ordinary signal input and/or output of the pad 36.

Figure 7:
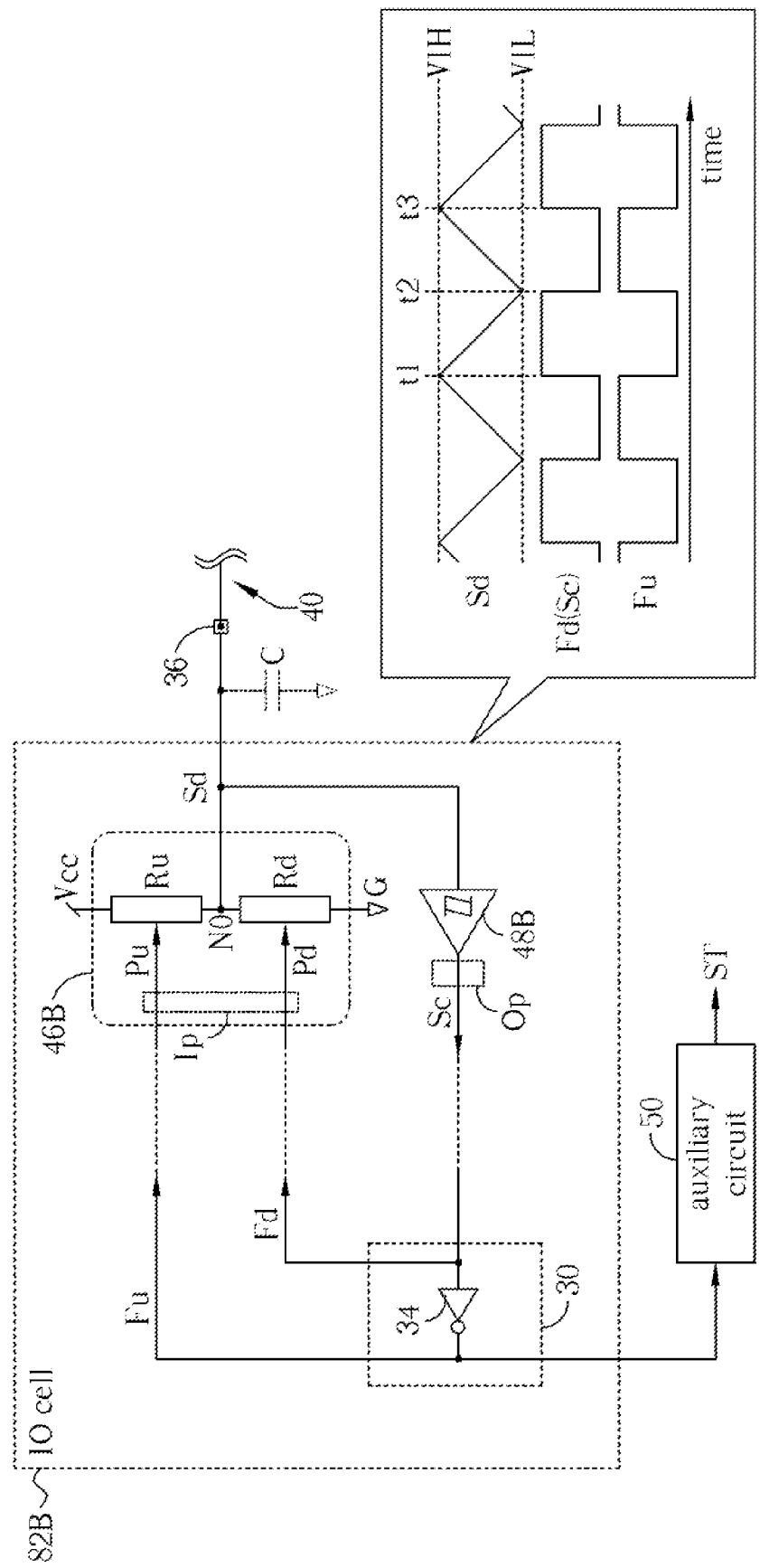
FIG. 7 shows another embodiment to implement the concept disclosed in FIG. 5.

FIG. 6 depicts a resistive charge/discharge circuit with the elements Ru and Rd in an output buffer 42. However, not only IO buffer can form this circuit, a pure input buffer with elements Ru and Rd can also achieve such resistive charge/discharge function. Please refer to FIG. 7, which conceptually illustrates an alternative embodiment where a resistive charge/discharge circuit, which can be a portion of an input buffer, is used to test a die to die interconnection 40 corresponding to a pad 36. In FIG. 7, a controlled circuit 46B in an IO cell 82B has resistive elements Ru and Rd respectively controlled by signals Pu and Pd. This controlled circuit 46B can be a portion of an input buffer of the IO cell 82B. More generally, this controlled circuit 46B can be any portion of the IO cell 82B.

Also in the IO cell 82B, an input portion 48B receives a signal Sd and provides a corresponding signal Sc, and an inverter 34B acts as a feedback circuit. In an embodiment, the input portion 48B causes a transition from logic 0 to logic 1 in the signal Sc when the signal Sd reaches a threshold VIH, and causes a transition from logic 1 to logic 0 in the signal Sc when the signal Sd reaches another threshold VIL. Other circuits (e.g., output buffer and/or multiplexers similar to 32A-32C in FIG. 6) are not shown in FIG. 7 for simplicity. While performing die to die interconnection test, output function of the IO cell 82B is disabled, the inverter 34B works to provide two complement feedback signals Fu and Fd so they are respectively transmitted as signals Pu and Pd to control whether elements Ru and Rd conduct, thus a feedback loop is formed.

A timing illustration is also shown in FIG. 7 to depict waveforms of signals Sd, Fd and Fu while testing die to die interconnection. During time t1 to t2, the resistive element Ru, turned on by signal Fd, conducts a charge current path from the power voltage Vcc to a total capacitor C appeared on the pad 36, thus the signal Sd linearly increases until it reaches the threshold Vt1 at time t2. At time t2, the input buffer circuit 48B causes a transition in signal Sc, then both signals Fd and Fu change. Accordingly, the element Ru turns off and the resistive element Rd turns on to provide a discharging path from the capacitor C to the ground voltage G so as to weaken the signal Sd until it reaches another threshold Vt2 at time t3. Such periodic charge/discharge cycles, and the oscillating frequency will reflect capacitance of the capacitor C, as well as state of the die to die interconnection 40.

Figure 8:
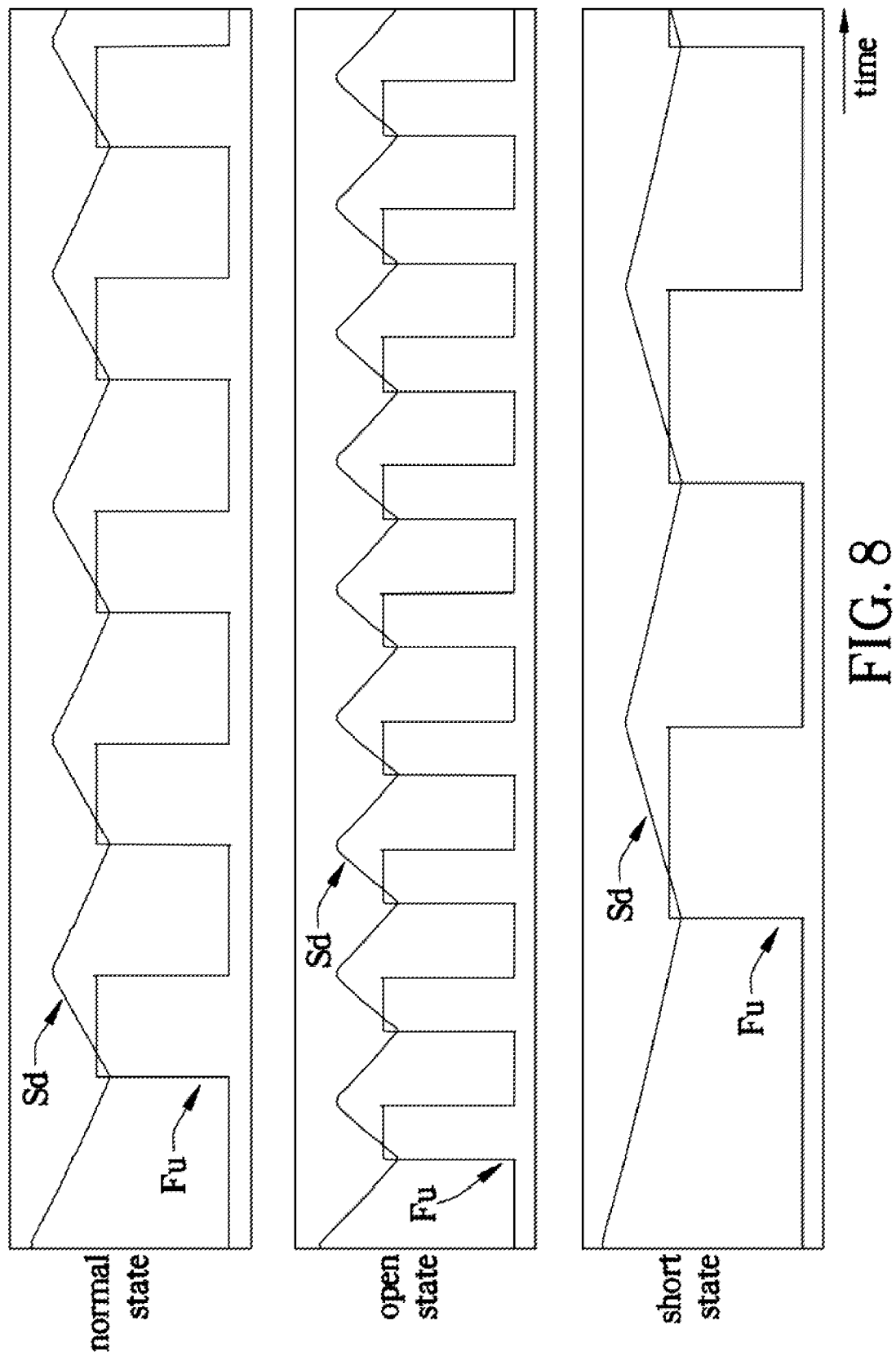
FIG. 8 depicts possible waveforms of some signals in FIGS. 6 and 7 while testing die to die interconnection.

Following the embodiment of FIG. 6 and FIG. 7, please refer to FIG. 8, which illustrates waveforms of related signals (like signals Fu and Sd) in different states while testing the die to die interconnection 40. The transverse axis of the waveforms represents time, and the longitudinal axis represents amplitude. As previously discussed, the elements Ru and Rd in the driving stage of the output buffer 42 (FIG. 6) or in the controlled circuit 46B (FIG. 7) respectively provide equivalent resistors to charge/discharge the total capacitor C appeared on the pad 36, so the signal Sd will substantially rise and fall linearly to demonstrate a saw-tooth waveform, and the timing characteristic, including linear rise time, fall time and period, of the saw-tooth waveform will be proportional to capacitance of the total capacitor C. As a result, the oscillating frequency of both signals Fu and Sd will be inversely proportional to capacitance of the total capacitor C.

As shown in top, middle and bottom of FIG. 7, while testing the die to die interconnection, when the die to die interconnection is respectively in normal state, open state and short states, the oscillating frequencies of the signals Sd and Fu in normal, open and short states will approach an approximate rational relation 1:2:0.5 (for certain typical die to die interconnection test, frequency relation would be 9.44 MHz: 17.19 MHz: 5.03 MHz), reflecting an approximate capacitance rational relation 2:1:4 of the total capacitor C respectively in normal, open and short states. This capacitance relation can be derived by observing FIGS. 2-4 if the equivalent capacitors Ci, Co, Ci1 and Co1 are approximately equal.

Figure 9:
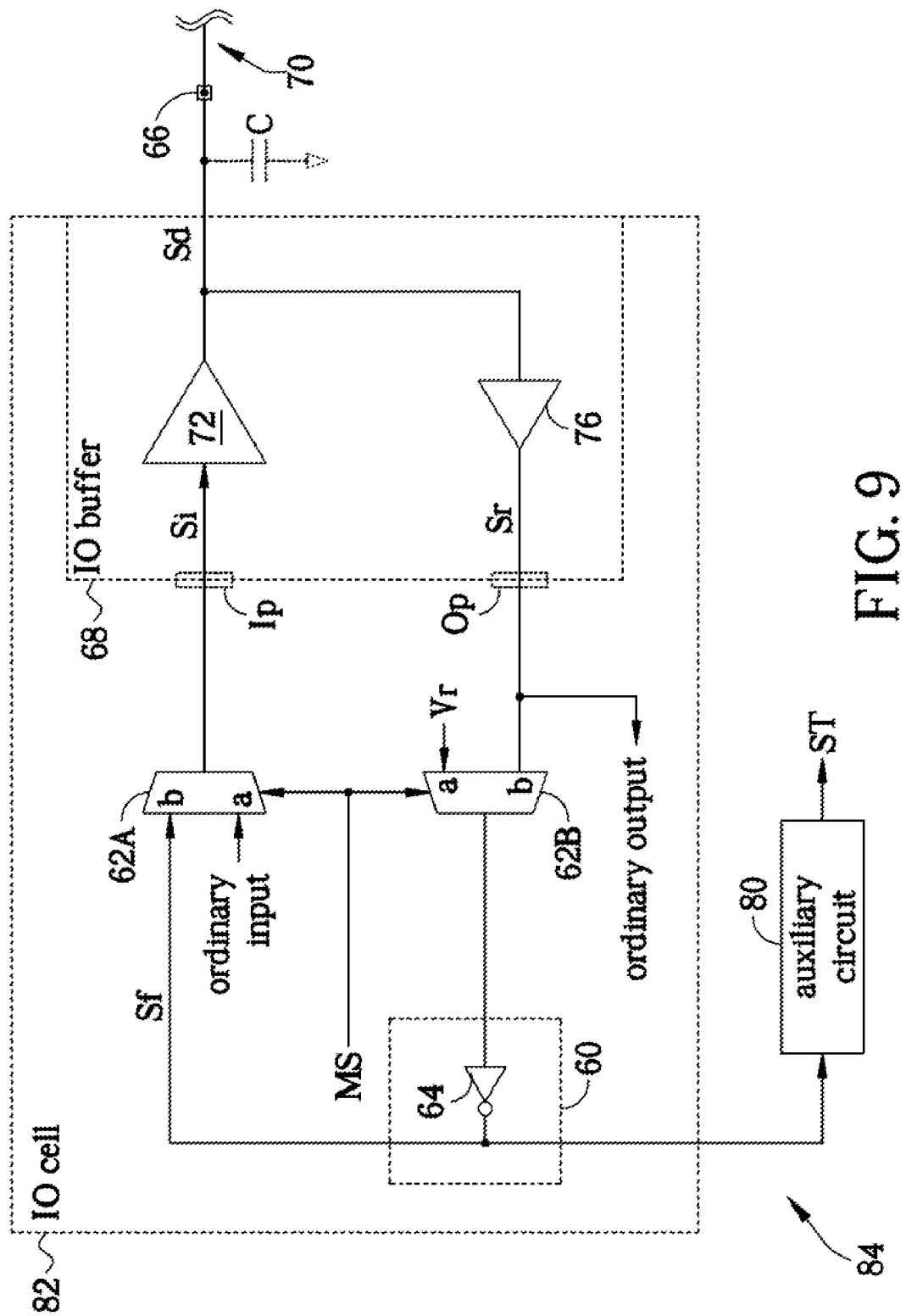
FIG. 9 shows another embodiment to implement the concept disclosed in FIG. 5.

The driving stage (elements Rd and Ru) of the output buffer 42 in FIG. 6 or in the controlled circuit 46B of FIG. 7 provides resistive charging/discharging to the total capacitor C appeared on the pad to drive a saw-tooth waveform on the pad. Alternatively, the present invention applies to other kind of output buffer. Please refer to FIG. 9 which depicts another embodiment of an IO circuit according to the present invention. As shown in FIG. 9, the IO circuit 84 capable of testing a die to die interconnection 70 connected to a pad 66 includes an IO cell 82 and an auxiliary circuit 80. The IO cell 82 includes an IO buffer 68 and a feedback circuit 60 as well as two multiplexers 62A and 62B to support die to die interconnection test. The IO buffer 68 includes an input buffer 76 and an output buffer 72 to support functionality of a bi-directional IO buffer. The output buffer 72, coupled to the pad 66, can drive an output signal Sd on the pad 66 according to a signal received from an input port Ip (e.g., signal Si). The input buffer 76, also coupled to the pad 66, can provide a received signal Sr to an output port Op according to a signal received from the pad 66 (e.g., a signal Sd).

The feedback circuit 60, coupled between the input port Ip and the output port Op, includes an inverter 64 to provide a feedback signal Sf. More specifically, the feedback circuit 30 is coupled to the output port Op through the multiplexer 62B, and is coupled to the input port Ip through the multiplexers 62A. The multiplexers 62A and 62B are controlled by a signal MS for selecting a standard mode or a test mode.

The IO cell 82 and the IO circuit 84 can operate in standard mode and test mode, and the signal MS reflects the mode in which the IO cell 82 operates. When the IO circuit 84 and the IO cell 82 work in the test mode, i.e., while testing the die to die interconnection 70, the input buffer 76 operates in an input mode to provide the received signal Sr according to the signal Sd driven by the output buffer 72. The multiplexer 62B, controlled by the signal MS, switches to transmit the signal Sr from the output port Op to the feedback circuit 60. The inverter 64 inside the feedback circuit 60 generates the corresponding feedback signal Sf. The multiplexer 62A, also controlled by the signal MS, switches to transmit the signals Sf to the input port Ip to become the signal Si. Thus, an oscillating feedback is formed to complete a feedback loop, and an oscillating frequency of the feedback loop will reflect the equivalent total capacitor C appeared on the pad 66, as discussed in FIGS. 2-5. The auxiliary circuit 80 can therefore reflect the state of the die to die interconnection with a signal ST according to a timing characteristic (e.g., a frequency) of a signal (e.g., the feedback signal Sf) of the feedback loop. Functionality and possible embodiments of the auxiliary circuit 80 are similar to those of the auxiliary circuit 50 shown in FIG. 6. That is, the signal ST can either be a signal with a frequency being a quotient of frequency dividing if the auxiliary circuit 80 is a frequency divider, or the signal ST can directly reflect a result of frequency comparison by comparing whether the oscillating frequency of the feedback loop is in a predetermined range.

On the other hand, when the IO circuit 84 and the IO cell 82 operate in the standard mode (i.e., while die to die interconnection test being finished or not performing), the multiplexer 62B, controlled by the signal MS, switches to tie a reference voltage Vr (e.g., power voltage or ground voltage) to the feedback circuit 60 instead of keeping on transmitting the signal Sr to the feedback circuit 60, such that the feedback circuit 30 is kept static. Also, the multiplexer 62A switches to transmit ordinary input signal to the input port Ip, instead of the feedback signal Sf. With switching operation of the multiplexer 62A, the feedback circuit 60 is decoupled from the input port Ip, and the oscillating feedback is thus disconnected to break the feedback loop of test mode. Then the IO buffer 68 can work like an ordinary bi-direction IO buffer.

Figure 10:
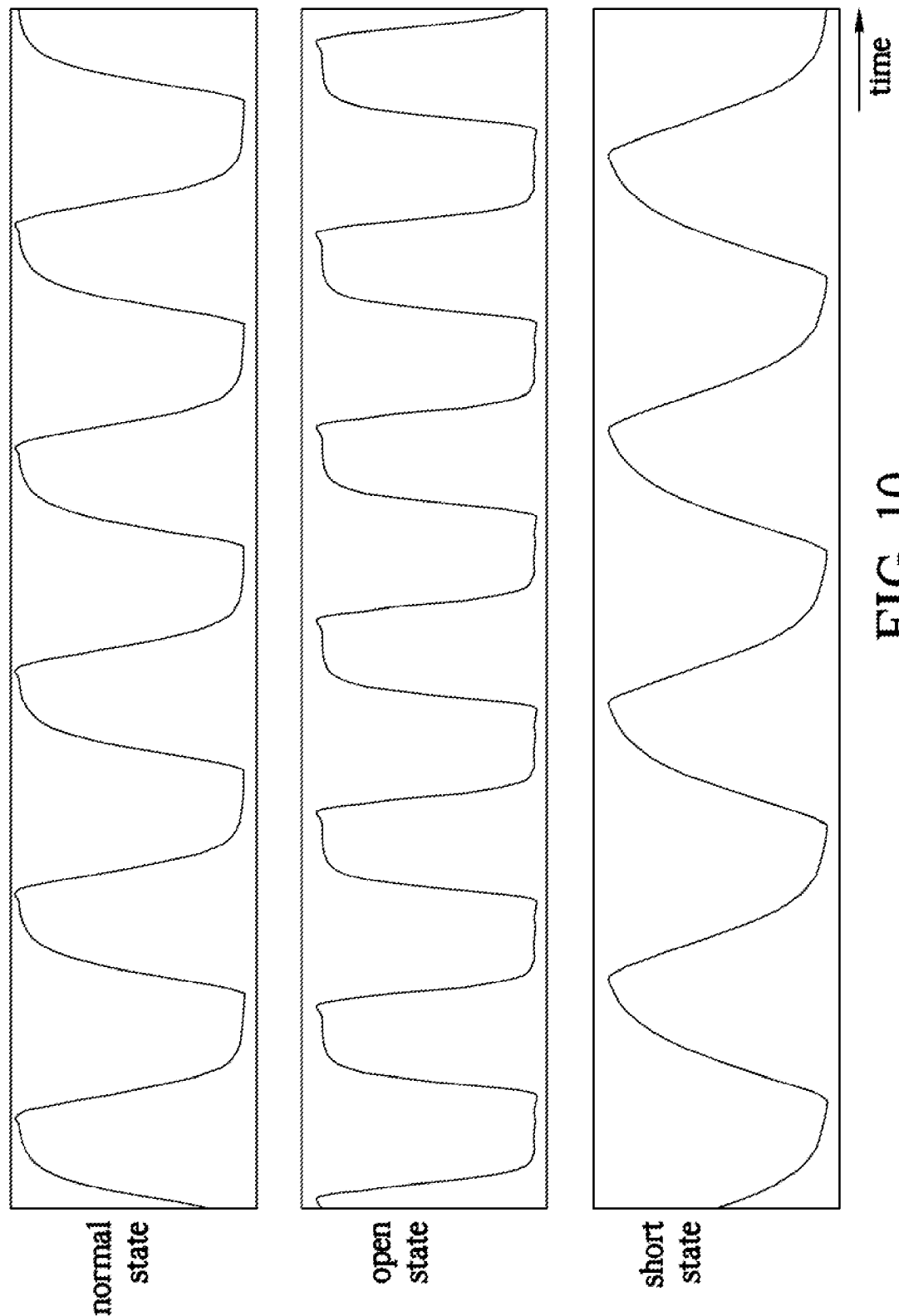
FIG. 10 depicts possible waveforms of a signal in FIG. 9 while testing die to die interconnection.

Following the embodiment shown in FIG. 9, please refer to FIG. 10 which illustrates possible waveforms of a signal (e.g., the signal Sd) of the feedback loop shown in FIG. 9 while testing the die to die interconnection 70. The transverse axis of the waveforms represents time, and the longitudinal axis represents amplitude. As shown in top, middle and bottom of FIG. 10, as the die to die interconnection is of normal, open or short state, the signal oscillating frequency will respectively be middle, faster or slower. For certain typical die to die interconnection test, frequency relation would be (274 MHz): (317 MHz):(222 MHz).

Figure 11:
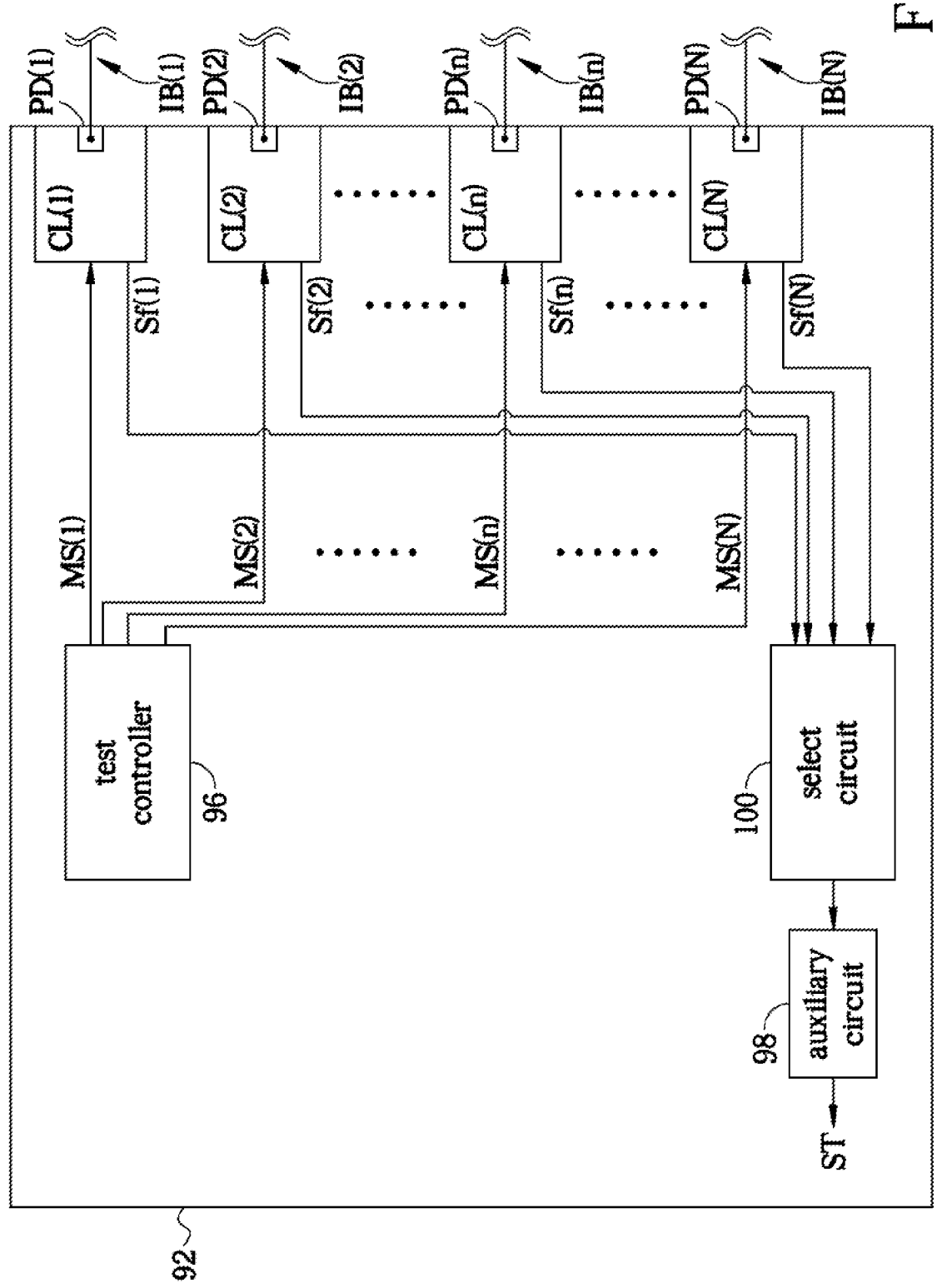
FIG. 11 illustrates a chip-level die to die interconnection test arrangement according to an embodiment of the present invention.

To implement the present invention to a die in SiP, all the IO cells coupled to pads with die to die interconnections to other die/dice can be replaced according to the proposed IO cells (e.g., IO cell 52 or 82 respectively shown in FIGS. 6 and 9) or the input buffer with elements Ru and Rd discussed in FIG. 7. Please refer to FIG. 11 which illustrates a chip-level arrangement for implementation of the present invention. A die 92 has several pads (e.g., IO pads) PD(1), PD(2), ... PD(n) to PD(N), each IO pad PD(n) (for n=1, 2, ... N) corresponds to an IO cells CL(n) and connects to a die to die interconnection IB(n) for signal interchange with other die/dice (not shown). To apply the presented invention to the die 92, each IO cell CL(n) is implemented based on embodiment suggested in FIGS. 6, 7 and/or 9 (and FIG. 5). Therefore, similar to IO cells 52 and 82 respectively shown in FIGS. 6, 7 and 9, every IO cell CL(n) accepts a corresponding signal MS(n) for mode selection (i.e., standard mode or test mode) and outputs a corresponding signal Sf(n) (e.g., the feedback signal) of its feedback loop generated while testing corresponding interconnection IB(n). A test controller 96 can be included in the die 92 for controlling testing of die to die interconnections IB(1) to IB(N) by providing signals MS(1) to MS(N). An auxiliary circuit 90 based on the auxiliary circuits 50 and 80 respectively discussed in FIGS. 6 and 9 and a select circuit 100 are also included. Controlled by the test controller 96, the select circuit 100 selects which signal Sf(n) is transmitted to the auxiliary circuit 98 according to the signal MS(n).

While testing the die to die interconnections IB(1) to IB(N), the test controller 96 can sequentially trigger die to die interconnection test for each IO cell CL(n) by signal MS(n), such that each IO cell CL(n) tests the corresponding die to die interconnection in different time. For example, the test controller 96 uses the signal MS(1) to trigger the IO cell CL(1) starting testing die to die interconnection IB(1), and keeps other IO cell CL(n) (n being other than 1) not performing testing with their corresponding signal MS(n). The signal Sf(1) is selected by the select circuit 100 (corresponding to triggering of signal MS(1)) so the signal Sf(1) can be fed into the auxiliary circuit 90 to reflect states of the die to die interconnection IB(1) with the signal ST. Next, the test controller 96 manipulates the signals MS(1) to MS(N) such that the IO cell CL(2) starts testing its die to die interconnection IB(2), and other IO cell CL(n) (n other than 2) rests without performing die to die interconnection test. The corresponding signal Sf(2) is selected to be transmitted to the auxiliary circuit 98, then the auxiliary circuit 90 can reflect states of the die to die interconnection IB(2) with the signal ST according to signal Sf(2). By such sequential testing order, the IO cells CL(1) to CL(N) can share a common auxiliary circuit 90. In an alternative embodiment, IO cells can be grouped to different groups, each group includes a plurality of IO cells and a shared auxiliary circuit.

Comparing to prior art die to die interconnection test scheme, the present invention performs die to die interconnection testing according to electrical characteristic (e.g., timing and/or frequency response) of die to die interconnection instead of logic functionality testing adopted in prior art, therefore the present invention can generally apply to dice without boundary scan support or suitable test patterns. To test die to die interconnections between two dice, only one of the dice needs to implement IO circuit of the present invention, so cost and resource requirement of die to die interconnection test can be further reduced. Although replacing an IO cell having a single output buffer with an IO cell proposed in the present invention may introduce a certain area overhead, the overhead is usually small since the output buffer usually dominates area of an IO cell due to its output driving capability. The present invention can generally apply to die to die interconnection testing of SiP, MCM (Multi-Chip Module), stacked-chip package, 3D IC and any package structure with encapsulated die to die interconnection between or among dice. Also, IO cell structure disclosed in the present invention can be included in a cell library (like an IO cell library) as an intellectual property (IP) resource for IC design and implementation.

While the invention has been described in terms of what is presently considered to be the most practical and preferred embodiments, it is to be understood that the invention needs not to be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. An IO circuit capable of testing die to die interconnection, comprising:
    a controlled circuit coupled between an input port and a pad connected to an die to die interconnection, the controlled circuit driving an output signal on the pad according to a signal received from the input port while testing the die to die interconnection;
    an input portion coupled between an output port and the pad, the input portion receiving a first signal from the pad and providing a second signal to the output port according to the first signal received from the pad, wherein the second signal is different from the first signal received from the pad;
    a feedback circuit, comprising an inverter, coupled between the input port and the output port, wherein while testing the die to die interconnection, the feedback circuit provides a feedback signal, with a frequency varying on different states of the die to die interconnection, to the input port according to the received signal.

2. The IO circuit of claim 1 further comprising an auxiliary circuit coupled to the feedback circuit for reflecting the state of the die to die interconnection.

3. The IO circuit of claim 2, wherein the auxiliary circuit is a frequency divider for reflecting the state of the die to die interconnection according to a frequency of the feedback signal while testing the die to die interconnection.

4. The IO circuit of claim 2, wherein the auxiliary circuit decides whether a frequency of a signal related to the feedback signal is in a predetermined range.

5. The IO circuit of claim 2, wherein the auxiliary circuit reflects an open state, a short state or a normal state of the die to die interconnection according to the feedback signal while testing the die to die interconnection.

6. The IO circuit of claim 1 further comprising:
    a multiplexer controlling whether the feedback signal is transmitted to the input port such that the feedback signal is transmitted to the input port while testing the die to die interconnection and the feedback signal is not transmitted to the input port while not testing the die to die interconnection.

7. The IO circuit of claim 1, wherein the feedback circuit provides the feedback signal to cause an oscillating feedback while testing the die to die interconnection.

8. An IO circuit capable of testing die to die interconnections, comprising:
    a plurality of IO cells, each IO cell corresponding to a pad connected to a respective die to die interconnection, each IO cell comprising:
        a controlled circuit coupled between an input port and the corresponding pad, the controlled circuit driving an output signal on the corresponding pad according to a signal received from the input port while testing the die to die interconnection;
        an input portion coupled between an output port and the pad, the input portion receiving a first signal from the pad and providing a second signal to the output port according to the first signal received from the corresponding pad, wherein the second signal is different from the first signal received from the pad; and
        a feedback circuit, comprising an inverter, coupled between the input port and the output port, wherein while testing the corresponding die to die interconnection, the feedback circuit provides a feedback signal, with a frequency varying on different states of the die to die interconnection, to the input port according to the received signal; and
    an auxiliary circuit coupled to the IO cells, the auxiliary circuit reflecting a state of the die to die interconnection corresponding to each IO cell according to a frequency of a signal of each IO cell while testing the die to die interconnection.

9. The IO circuit of claim 8 further comprising:
    a test controller controlling testing of die to die interconnections such that each IO cell tests the corresponding die to die interconnection in different time.

10. The IO circuit of claim 8, wherein the auxiliary circuit is a frequency divider for reflecting the state of the die to die interconnection corresponding to each IO cell according to a frequency of the signal of each IO cell while testing the corresponding die to die interconnection.

11. The IO circuit of claim 8, wherein the auxiliary circuit decides whether a frequency of the signal of each IO cell is in a predetermined range for reflecting the state of the corresponding die to die interconnection while testing the corresponding die to die interconnection.

12. The IO circuit of claim 8, wherein the state of the die to die interconnection refers an open state, a normal state or a short state.

13. A circuit capable of testing die to die interconnection, comprising:
    a controlled circuit coupled between an input port and a pad connected to an die to die interconnection, the controlled circuit driving an output signal on the pad according to a signal received from the input port while testing the die to die interconnection;

an input portion coupled to the pad, the input portion receiving a first signal from the pad and providing a second signal according to the first signal received from the pad, wherein the second signal is different from the first signal received from the pad;
a feedback circuit coupled between the controlled circuit and the input portion, wherein while testing the die to die interconnection, the feedback circuit provides a feedback signal, with a frequency varying on different states of the die to die interconnection, corresponding to the received signal; and
a multiplexer controlling whether the feedback signal is transmitted to the input port such that the feedback signal is transmitted to the input port while testing the die to die interconnection and the feedback signal is not transmitted to the input port while not testing the die to die interconnection.

14. The circuit of claim 13 further comprising an auxiliary circuit coupled to the feedback circuit for reflecting the state of the die to die interconnection.

15. The circuit of claim 13, wherein the controlled circuit comprises two resistive elements.

* * * * *